(12) United States Patent
Heist et al.

(10) Patent No.: US 6,298,080 B1
(45) Date of Patent: *Oct. 2, 2001

(54) NARROW BAND EXCIMER OR MOLECULAR FLUORINE LASER WITH ADJUSTABLE BANDWIDTH

(75) Inventors: Peter Heist, Jena; Jürgen Kleinschmidt, Weissenfels, both of (DE)

(73) Assignee: Lambda Physik AG, Goettingen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 09/452,353

(22) Filed: Dec. 1, 1999

Related U.S. Application Data
(60) Provisional application No. 60/124,241, filed on Mar. 12, 1999.

(51) Int. Cl.[7] .............................. H01S 3/08; H01S 3/225; H01S 3/10

(52) U.S. Cl. ................................ 372/99; 372/95; 372/57; 372/20

(58) Field of Search ................................ 372/99, 57, 20, 372/95

(56) References Cited

U.S. PATENT DOCUMENTS

| | | |
|---|---|---|
| 3,582,190 | 6/1971 | Smith ................................ 350/310 |
| 4,399,540 | 8/1983 | Bücher ................................ 372/20 |
| 4,664,488 * | 5/1987 | Sawicki et al. ...................... 350/611 |
| 4,696,012 | 9/1987 | Harshaw ................................ 372/99 |
| 4,829,536 | 5/1989 | Kajiyama et al. ...................... 372/57 |
| 4,856,018 | 8/1989 | Nozue et al. ............................ 372/98 |
| 4,873,692 | 10/1989 | Johnson et al. ........................ 372/20 |
| 4,906,087 | 3/1990 | Ealey et al. ............................ 359/849 |
| 4,972,429 | 11/1990 | Herbst ................................ 372/100 |
| 4,975,919 | 12/1990 | Amada et al. .......................... 372/33 |
| 5,081,635 | 1/1992 | Wakabayashi et al. ................ 372/57 |
| 5,095,492 | 3/1992 | Sanstrom .............................. 372/102 |

(List continued on next page.)

FOREIGN PATENT DOCUMENTS

| | | |
|---|---|---|
| 0 472 727 A1 | 3/1992 | (EP) .............................. H01S/3/1055 |
| WO 96/16455 | 5/1996 | (WO) ................................ H01S/3/08 |

OTHER PUBLICATIONS

Press release entitled: "Lambda Physik shows readiness for the future challenge of microlithography," Fort Lauderdale, FL, Dec. 1997.

R.L. Sandstrom, "Measurements of beam charcteristics relevant to DUV microlithography on KrF excimer laser," SPIE vol. 1264, *Optical/Laser Microlithography III* (1990), pp. 505–519.

Technology World Briefs, "Laser Could Extend Optical Lithography into VUV," *Photonics Spectra*, Jan. 1998.

Shintaro Kawata et al., "Spatial coherence of KrF excimer lasers," *Applied Optics*, vol. 31, No. 3, Jan. 20, 1992, pp. 387–396.

Itving J. Bigio et al., "Injection–Locking Unstable Resonator Excimer Lasers," *IEEE J. of Quantum Electronics*, vol. QE–19, No. 9, Sep. 1983, pp. 1426–1436.

*Primary Examiner*—Teresa M. Arroyo
*Assistant Examiner*—James Menefee
(74) *Attorney, Agent, or Firm*—Sierra Patent Group, Ltd.; Andrew V. Smith

(57) ABSTRACT

A line-narrowed excimer or molecular fluorine laser system includes a gain medium surrounded by a resonator for generating a laser beam, a discharge circuit including a plurality of electrodes for energizing the gain medium and a line-narrowing unit within the resonator for narrowing the bandwidth of the laser system. The resonator includes a deformable resonator reflector. A technique for adjusting the bandwidth of the laser system includes adjusting a surface contour of the deformable resonator reflector. A desired bandwidth may be selected manually or using a processor which automatically controls the surface contour adjustment.

6 Claims, 3 Drawing Sheets

U.S. PATENT DOCUMENTS

| | | | |
|---|---|---|---|
| 5,142,543 | 8/1992 | Wakabayashi et al. | 372/32 |
| 5,150,370 | 9/1992 | Furuya et al. | 372/106 |
| 5,226,050 | 7/1993 | Burghardt | 372/20 |
| 5,559,816 | 9/1996 | Basting et al. | 372/27 |
| 5,596,456 | 1/1997 | Luecke | 359/831 |
| 5,646,954 | 7/1997 | Das et al. | 372/55 |
| 5,657,334 | 8/1997 | Das et al. | 372/33 |
| 5,684,822 | 11/1997 | Partlo | 372/95 |
| 5,748,316 | 5/1998 | Wakabayashi et al. | 356/352 |
| 5,761,236 | 6/1998 | Kleinschmidt et al. | 372/100 |
| 5,802,094 | 9/1998 | Wakabayashi et al. | 372/57 |
| 5,835,520 | 11/1998 | Das et al. | 372/57 |
| 5,852,627 | 12/1998 | Ershov | 372/108 |
| 5,856,991 | 1/1999 | Ershov | 372/57 |
| 5,901,163 | 5/1999 | Ershov | 372/20 |
| 5,917,849 | 6/1999 | Ershov | 372/102 |
| 5,946,337 | 8/1999 | Govorkov et al. | 372/92 |
| 5,970,082 | 10/1999 | Ershov | 372/102 |
| 5,978,409 | 11/1999 | Das et al. | 372/100 |
| 5,999,318 | 12/1999 | Morton et al. | 359/572 |
| 6,021,153 * | 2/2000 | Okada | 372/99 |
| 6,154,470 * | 11/2000 | Basting et al. | 372/19 |

* cited by examiner

NARROW BAND EXCIMER OR MOLECULAR FLUORINE LASER WITH ADJUSTABLE BANDWIDTH

PRIORITY

This application claims the benefit of priority to U.S. Provisional patent application No. 60/124,241, filed Mar. 12, 1999.

BACKGROUND OF THE INVENTION

1. Field of the Invention

The invention relates to an gas lasers such as excimer lasers, and particularly to an adjustably line-narrowed laser system for use with a photolithographic imaging system.

2. Discussion of the Related Art

A line-narrowed excimer or molecular fluorine laser used for microlithography provides an output beam with specified narrow spectral linewidth. It is desired that parameters of this output beam such as wavelength, linewidth, and energy and energy dose stabilty be reliable and consistent. Narrowing of the linewidth is generally achieved through the use of a linewidth narrowing and/or wavelength selection and wavelength tuning module (hereinafter "line-narrowing module") consisting most commonly of prisms, diffraction grating and, in some cases, optical etalons. A line-narrowing module typically functions to disperse incoming light angularly such that light rays of the beam with different wavelengths are reflected at different angles. Only those rays fitting into a certain "acceptance" angle of the resonator undergo further amplification, and eventually contribute to the output of the laser system.

Depending on the type and extent of line-narrowing and/or selection and tuning that is desired, and the particular laser that the wave-length selector is to be installed into, there are many alternative linenarrowing configurations that may be used. For this purpose, those shown in U.S. Pat. Nos. 4,399,540, 4,905,243, 5,226,050, 5,559,816, 5,659,419, 5,663,973, 5,761,236, and 5,946,337, and U.S. patent applications Ser. Nos. 09/317,695, 09/130,277, 09/244,554, 09/317,527, 09/073,070, 60/124,241, 60/140,532, and 60/140,531, each of which is assigned to the same assignee as the present application, and U.S. Pat. Nos. 5,095,492, 5,684,822, 5,835,520, 5,852,627, 5,856,991, 5,898,725, 5,901,163, 5,917,849, 5,970,082, 5,404,366, 4,975,919, 5,142,543, 5,596,596, 5,802,094, 4,856,018, and 4,829,536, are each hereby incorporated by reference into the present application.

Depending on the extent of line-narrowing that is desired, excimer laser systems can be broadly classified into three general groups: broad-band, semi-narrow band and narrowband. A fourth classification, very narrow-band, is sometimes referred to when it is desired to distinguish those lasers in the narrow-band group that have a particularly very narrow output emission bandwidth. Broadband excimer lasers do not have any line narrowing unit or components. Therefore, the relatively broad (i.e., 300 pm) characteristic output emission bandwidth of a KrF or ArF laser, e.g., is outcoupled from the laser resonator.

A semi-narrow band laser has a characteristic output that is narrowed using most typically prisms. The output emission bandwidth of the semi-narrowed laser is reduced for a KrF or ArF laser from around 300 pm to less than 100 pm. The semi-narrow band laser may be used in combination with catadioptic (reflective) optical imaging systems for industrial photolithography.

A narrow band laser typically further includes a grating such that the line-narrowing unit comprises a littrow configuration of prisms and a grating. One or more etalons may also be added for further line-narrowing, and there are other techniques described in the patents and patent applications referenced above. Such techniques can narrow the linewidth to below 1 pm. As such, narrow band lasers are used in combination with refractive optical imaging systems.

Typical line-narrowing modules suffer from a common limitation. That is, the bandwidth is fixed, and can only be adjusted by substituting a different line-narrowing module into the laser resonator having optical components with different beam expanding and/or dispersive properties. Alternatively, one or more components of an existing line-narrowing module may be replaced. In either case, the bandwidth of the laser having the conventional line-narrowing unit may not be adjusted in real-time, i.e., without replacing or disassembling the line-narrowing unit.

FIG. 1 schematically illustrates a conventional resonator design for a line-narrowed excimer or molecular fluorine laser. The resonator design shown in FIG. 1 includes a gain medium 1, an output coupler 2, a beam expanding prism 3, a dispersive prism 4 and a resonator reflector 5. The resonator reflector 5 may be a highly reflective mirror in which case the resonator design is for a semi-narrow band laser. The resonator reflector 5 may also be a dispersive prism in which case the resonator design is for a narrow band laser.

The output emission linewidth of a laser having a resonator design as shown in FIG. 1 is fixed and determined by the beam expanding power of the beam expander 3 and the dispersive power of the dispersive element 4 (and also the dispersive power of the grating if one is used). To change the bandwidth of a laser whose resonator configuration is schematically illustrated at FIG. 1, either the prism material, the dispersion or the geometry of the prisms 3, 4 would be changed. This means replacing already installed prisms with new ones having the different refractive index or geometrical properties, or replacing the entire line-narrowing module of the laser. It is desired to have a resonator design wherein the bandwidth may be adjusted without replacing components of an installed line-narrowing unit or the entire line-narrowing unit itself.

One technique for adjusting a laser linewidth without replacing the line-narrowing unit itself or components of an installed line-narrowing unit, is described at U.S. patent application Ser. No. 09/244,554 incorporated by reference above. In the '554 application, a beam expander has an adjustable magnification which in turn alters the dispersive power of the dispersion element. A preferred embodiment describes a pair of prisms that are synchronously rotatable for adjusting the magnification of the beam expander, and a mirror or grating is tilted for adjusting the wavelength.

Another technique for performing linewidth adjustment is described at U.S. patent application Ser. No. 09/317,527, also incorporated by reference above. In the '527 application, a pressure tuned etalon is provided. The pressure of the gaseous volume between the plates of the etalon, or the spacing between the plates, is adjusted. By changing the pressure in the former step, the index of refraction is thereby changed. Either way the free spectral range of the etalon is changed as the pressure is tuned. The wavelength and linewidth may be adjusted in this way. However, the techniques set forth in the '527 application have a more advantageous use for line selection and wavelength tuning, than for adjusting the linewidth of a laser.

SUMMARY OF THE INVENTION

It is an object of the invention to provide an excimer or molecular fluorine laser system having an output beam bandwidth that is adjustable in real time, i.e., without replacing the line-narrowing module or one or more of its components.

In accord with the above object, a line-narrowed eximer or molecular fluorine laser system includes a gain medium surrounded by a resonator for generating a laser beam, a discharge circuit including a plurality of electrodes for energizing the gain medium and a line-narrowing unit within the resonator for narrowing the bandwidth of the laser system. The resonator includes a deformable resonator reflector. A technique for adjusting the bandwidth of the laser system includes adjusting a surface contour of the deformable resonator reflector. Preferably, the resonator reflector is a spherical or cylindrical highly reflective mirror having an adjustable curvature. A desired bandwidth may be selected manually or using a processor which automatically controls the surface contour adjustment.

DETAILED DESCRIPTION OF THE PREFERRED EMBODIMENT

The present invention is most advantageously used with a semi-narrow band excimer laser such as a KrF or ArF excimer laser having a characteristic bandwidth in excess of 200 pm, and an output beam narrowed typically using a dispersive prism to under 100 pm. Other lasers such as the molecular fluorine laser could benefit from the present invention as well.

In addition, the present invention is most advantageously used in a photolithographic system including a catadioptric or all-reflective imaging system. Acceptable input laser emission bandwidths for catadioptric imaging systems are from around 15 to 100 pm at 248 nm and from around 5 to 40 pm at 193 nm. For imaging systems using all-refractive optics, acceptable input laser emission bandwidths are from 0.4–0.8 pm and from 0.3–0.7 pm, respectively, when KrF and ArF laser input radiation sources are used. The present invention can be used with imaging systems including all-refractive optics. For example, an $F_2$-laser having an output beam linewidth of less than 1 pm may benefit in accord with the present invention, even though all-refractive optics are used for imaging the radiation onto the lithographic mask or reticle.

Figure 1:
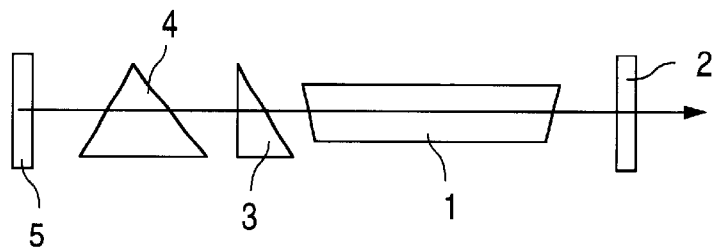
FIG. 1 schematically illustrates a conventional resonator design for a line-narrowed excimer or molecular fluorine laser.
Figure 2:
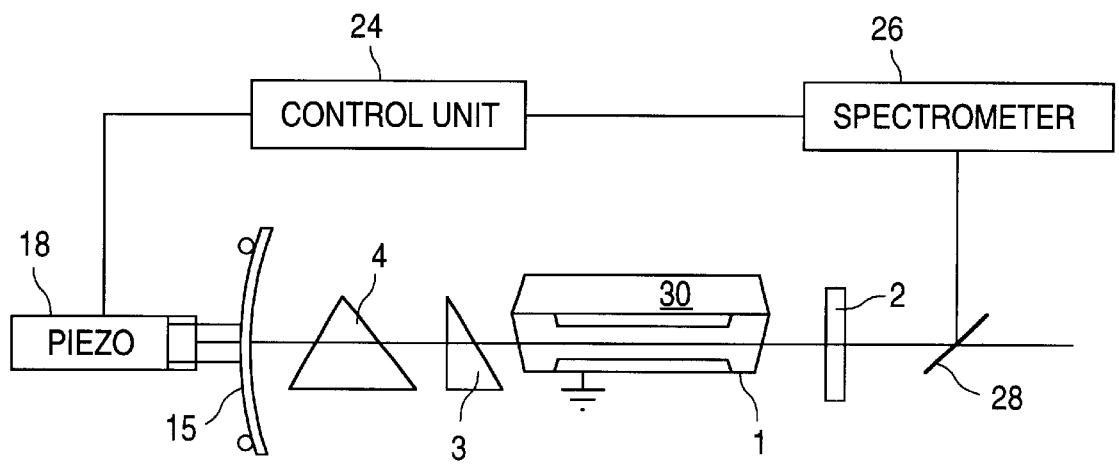
FIG. 2 schematically illustrates a resonator design for a line-narrowed laser in accord with a preferred embodiment of the present invention.

A resonator design in accord with a preferred embodiment of the present invention is shown schematically in FIG. 2. FIG. 2 shows a resonator design for an excimer laser including a gain medium 1, an outcoupling mirror 2, a beam expanding prism 3, and a dispersive prism 4, just as shown and described above with respect to FIG. 1.

The gain medium 1 is a laser gas including active and buffer gases. For the KrF laser, the active gases are krypton (~1.0%), and fluorine (~0.1%), and the buffer gas is neon. For the ArF laser, the active gases are argon and fluorine, and the buffer gas is neon and/or helium. Preferred gas mixtures and methods of stabilizing gas mixtures of these excimer lasers and other lasers such as the XeF, XeCl, KrCl excimer lasers, as well as the molecular fluorine laser, are described at: U.S. Pat. Nos. 4,393,505, 4,977,573 and 5,396,514, and U.S. patent applications Ser. Nos. 09/317,526, 09/418,052, 09/379,034, 60/160,126 and 60/124,785, each of which is assigned to the same assignee as the present application, and also U.S. Pat. Nos. 5,440,578 and 5,450,436, all of the above U.S. patents and patent applications being incorporated by reference into the present application. Gas purification systems, such as cryogenic gas filters (see U.S. Pat. Nos. 4,534,034, 5,136,605, 5,430,752, 5,111,473 and 5,001,721 assigned to the same assignee, and hereby incorporated by reference) or electrostatic particle filters (see U.S. Pat. No. 4,534,034, assigned to the same assignee and U.S. Pat. No. 5,586,134, each of which is incorporated by reference) are also being used to extend excimer laser gas lifetimes.

The outcoupling mirror 2 transmits the output laser beam of the laser system and reflects a portion of the beam incident upon it back into the gain medium for further amplification. The outcoupling mirror 2 may be replaced with a highly reflective mirror, and other means for outcoupling the laser beam may be used such as a beam splitter or partially reflective surface of a prism, laser window or other intraresonator optical component. The resonator may be a polarization coupled resonator.

The beam expanding prism 3 functions to magnify the beam. Other beam expanders may include more than one prism or other refractive elements such as a pair of lenses. The beam expanding prism 3 increases the size of the beam profile in the plane including the apex angle of the beam expanding prism 3. The beam expander thus prepares the beam for enhanced dispersion when it reaches the dispersion element, in this case a dispersive prism 4.

The dispersive prism 4 disperses the beam already expanded by the beam expander 3, and transforming the beam into one having wavelength dependence on lateral position within the beam, or in the direction of beam expansion, or in the plane of the apex angles of each of the beam expander 3 and the dispersive prism 4. Line narrowing occurs due to the dispersive prism 4 because those portions of the beam outside the acceptance angle of the resonator are not included in the output emission laser beam of the system. Thus, only a narrowed band of wavelengths remains within the acceptance angle of the resonator after the dispersive element 4, together with the beam expander 3, transform the resonating beam. The dispersive prism 4 could generally be replaced by a grating or be included in a resonator design including a grating. The grating is also used when enhanced line-narrowing is desired. One or more etalons can also be used for further line narrowing and/or line selection (see the '527 application referred to above). The prisms 3, 4 may comprise fused silica, calcium fluoride or a combination of these materials (see '236 patent, above).

In the preferred embodiment, the resonator reflector opposite the output coupler 2 is a highly reflective mirror or deformable resonator reflector 15. As discussed, a resonator in accord with the present invention could have such a deformable resonator reflector and a highly reflective mirror as a resonator pair, with outcoupling performed by other means. The resonator reflector pair may include a grating and the deformable mirror 15, with outcoupling performed by the other means described above. The deformable resonator reflector may be switched with the outcoupler 2 of FIG. 1, such that the outcoupler is deformable and the HR mirror fixed, or both may be deformable.

The preferred deformable mirror 15 is a cylindrical or spherical mirror. As such, the mirror 15 preferably has an adjustable radius of curvature. The mirror 15 may also have a convex or concave dome shape, wherein only a limited length of the reflecting surface of the mirror 15 has an adjustable curvature. The contour of the reflecting surface of the mirror 15 may be more complex, i.e., being described at least in a first plane by the formula $y=a+bx+cx^2+dx^3+\ldots$, where each of the coefficients may be any real number or zero, and preferably at least one higher order coefficient is non-zero. A different or no curvature may exist in the orthogonal plane, or the surface contour may be interdependently three-dimensional.

Generally, a driving element is used for adjusting the surface contour of the mirror 15. One such driving element that may be used in accord with the present invention to achieve a mirror 15 having an adjustable surface contour or radius of curvature is shown in FIG. 2. A piezo 18 is connected to the back of the mirror 15. The piezo may be crystal, ceramic or polymer-based. The piezo applies pressure to the center of the back of the mirror in an amount that depends on the electromagnetic energy supplied to the piezo 18 by a control unit 24. The control unit 24 also receives linewidth information from a spectrometer 26 that measures the linewidth of a split off portion of the main beam. A beam splitter 28 is shown for this purpose. The control unit 24 controls the piezo 18 based on the linewidth information the control unit 24 receives from the spectrometer 26, and selected bandwidth information. The control unit 24 may be a processor.

Figure 3:
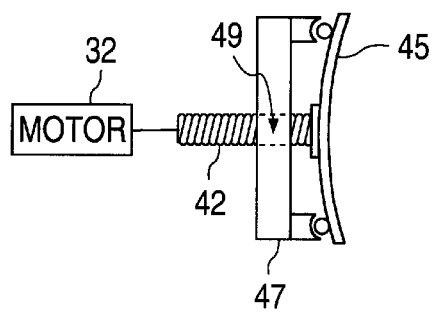
FIG. 3 shows a deformable mirror in accord with an alternative to the preferred embodiment of FIG. 2.

An alternative arrangement including an alternative driving element configuration for the deformable mirror 15 of FIG. 2 is shown at FIG. 3. In the arrangement of FIG. 3, the driving element includes a motor 32 used to drive a screw 42 to adjust the deformation of the mirror 45. The mirror 45 is contacted preferably at or near its center by one end of the screw 42. The other end of the screw 42 is contacted and turned using torque produced by the motor 32. The threads of the screw 42 work in a base 47 having a through hole 49 that is internally threaded. The back of the mirror 45 is also contacted away from its center where the screw contacts the back of the mirror 45.

Preferably, if the mirror 45 is a cylindrical one, then a pair of substantially straight components contact the back of the mirror collinearly with the curvilinear axis of the mirror 45. If the mirror is a spherical one, then a substantially circular component preferably contacts the back of the mirror, wherein the screw 42 contacts the back of the mirror 45 at the center of the circular component. As the screw is turned, the center of the mirror moves relative to the outer portions of the mirror causing the radius of curvature of the mirror 45 to change.

There are many varieties of ways to alternatively deform the resonator reflector 15 in accord with the present invention. For example, that which is taught in U.S. Pat. No. 5,095,492 for aging a grating curvature of a very narrow band (i.e., <1 pm) excimer laser used with a refractive optical imaging system for photolithography is hereby incorporated by reference into the present application.

Another driving element for producing the desired deformation of the mirror 15 would be a magnetic element, again preferably located at the back of the mirror. A portion of the mirror may be magnetic, and the magnetization of the magnetic element may be adjusted. A magnetic element such as is known to be used in a dynamic moving coil or ribbon, a moving armature, or magneto-restrictive arrangement of a loudspeaker may be used. An electrostatic driving element may be used, such as including a condenser, as is also known in the loudspeaker art. Further, the mirror 15 may comprise a diaphragm with a highly reflecting surface. Such a diaphragm is known, e.g., in the loudspeaker arts to have an adjustable surface contour. Some metallic reflecting materials used with loudspeaker arrangements having adjustable diaphragms include boron, berylium, aluminum and titanium.

The radius of curvature of the mirror 15 may be adjusted by sealing the bendable mirror 15 at an opening of a pressure-regulated enclosure. Reducing the pressure within the enclosure would cause the radius of curvature of the mirror 15 to decrease. Increasing the pressure would have the opposite effect. Thus, by controlling the pressure in the enclosure, the radius of curvature of the mirror 15 may be controlled.

Returning to FIG. 2, the wavelength may also be monitored by the spectrometer 26. The wavelength may be controlled by tilting the mirror 15. The energy may also be monitored by the spectrometer 26 or other device for energy detection. The energy may be controlled by controlling the energy of electrical pulses applied to the discharge electrodes of a discharge circuit 30, and/or by controlling the gas supply in the laser tube. Preferred circuits 30 and circuit components such as main and preionization electrodes are described at U.S. patent applications Ser. Nos. 08/842,578, 08/822,451, 09/390,146, 09/247,887, 60/128,227 and 60/162,645, each of which is assigned to the same assignee as the present application and which is hereby incorporated by reference, and preferred gas control techniques have been referred to above.

Figure 4A:
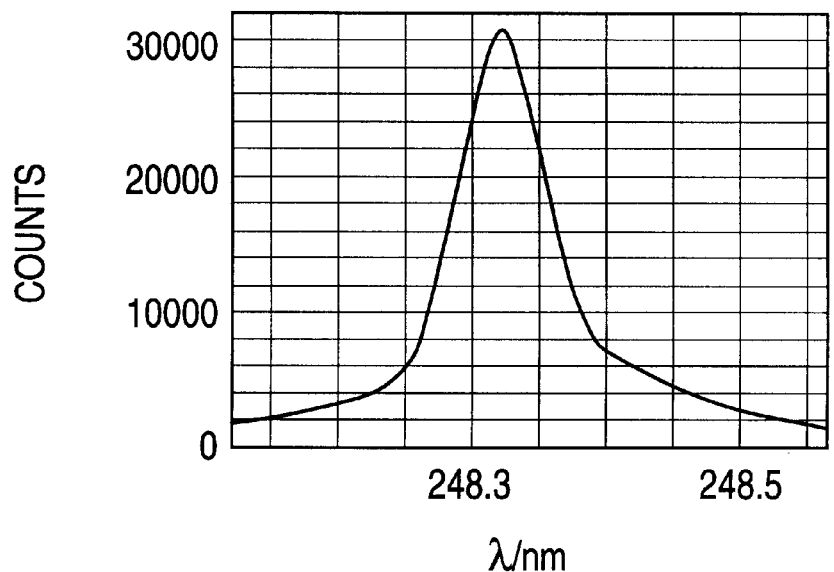
FIG. 4a shows a first output emission intensity versus wavelength spectrum of a line-narrowed KrF laser.
Figure 4B:
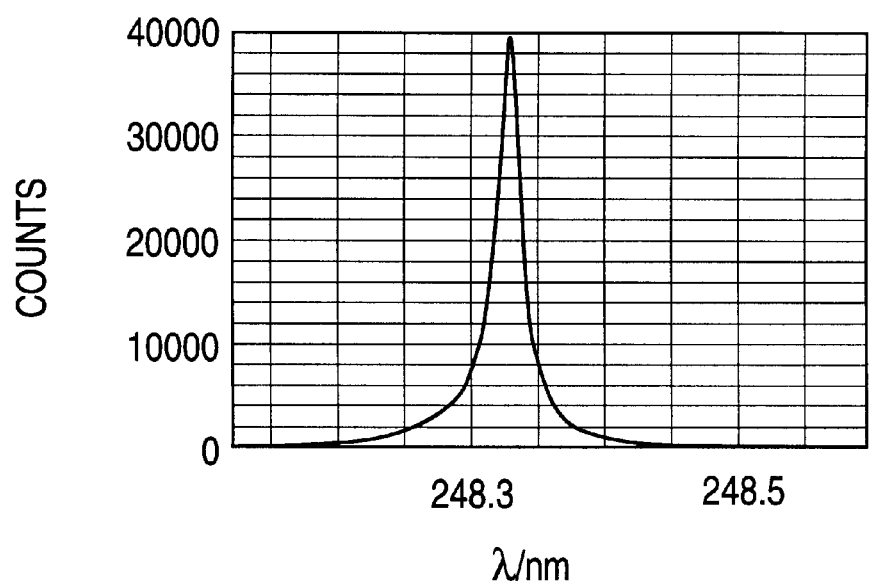
FIG. 4b shows second intensity versus wavelength spectrum for the same KrF laser as used in FIG. 4a, except the radius of curvature of the deformable mirror has been adjusted in accord with the preferred embodiment of the present invention.

FIGS. 4a and 4b illustrate an advantageous feature of the present invention, i.e., the adjustability of the bandwidth of a laser having a resonator design in accord with the present invention. FIG. 4a shows a first output emission intensity versus wavelength spectrum of a line-narrowed KrF laser. The output emission shown in FIG. 4a has a center wavelength around 248.325 nm and a bandwidth around 80 pm FWHM.

FIG. 4b shows a second output emission spectrum of the same KrF laser except that the radius of curvature of the deformable resonator reflector 15 has been adjusted. The output spectrum of FIG. 4b is markedly different than that shown in FIG. 4a. Although the center wavelengths of the spectra shown in FIGS. 4a and 4b are about the same, the bandwidth of the spectrum of FIG. 4b is significantly narrower than that shown in FIG. 4. The bandwidth of the spectrum FIG. 4b is about 19 pm which is four times narrower than the spectrum shown in FIG. 4a. The spectra shown in FIGS. 4a–4b illustrate the advantage of bandwidth adjustability of the resonator design of the present invention for use with a KrF-excimer laser.

Figure 5:
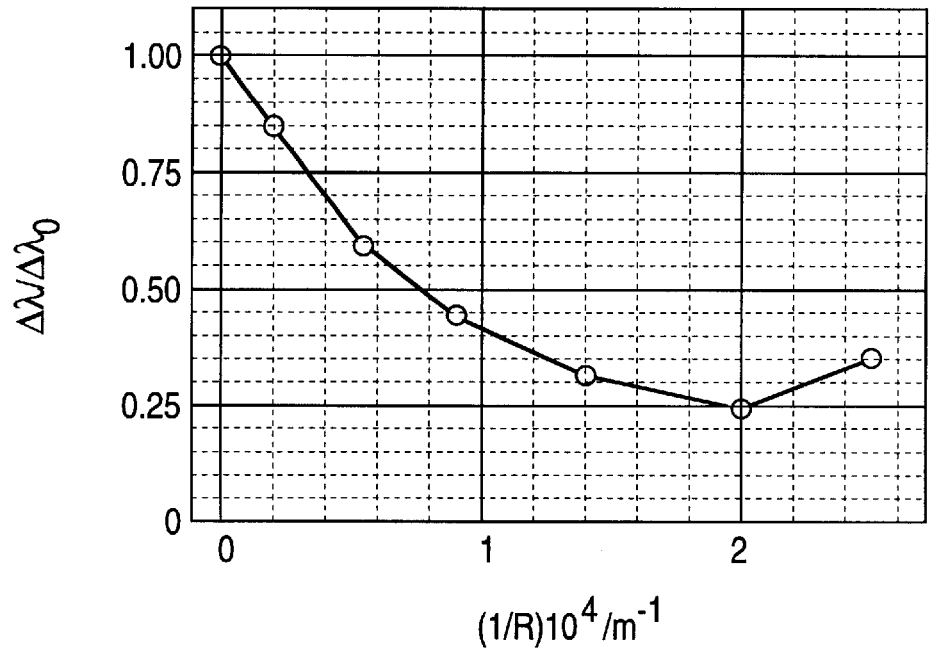
FIG. 5 is a plot showing the change in bandwidth of the output beam of a KrF laser versus the inverse of the radius of curvature of the deformable mirror in accord with the preferred embodiment of the present invention.

Another plot is shown in FIG. 5 which illustrates advantages of the present invention. In FIG. 5, the change in bandwidth of the output beam of a KrF laser in accord with the present invention including a resonator design having a deformable resonator reflector 15 as shown in FIG. 2 is plotted versus the inverse of the radius of curvature of the deformable mirror 15. The ordinate axis is bandwidth divided by an arbitrary starting bandwidth. The starting bandwidth, as discussed above, depends on such things as the magnification of the beam expander and the dispersive power of the dispersive element or elements in the resonator of the KrF laser being used. The coordinate axis is the inverse of the radius of curvature of the deformable mirror 15.

As the coordinate 1/R of the plot shown in FIG. 5 is increased, or as the radius of curvature of the deformable resonator reflector 15 is decreased, the output bandwidth of the KrF laser is shown to decrease from the starting bandwidth to about ¼ of the starting bandwidth (e.g., from around 80 pm to around 20 pm) as the deformable mirror 15 is deformed from a flat contour to one having a radius of curvature around 5000 m. FIG. 5 further shows that the bandwidth begins to increase as the radius of curvature is further reduced below 5000 m.

Figure 6:
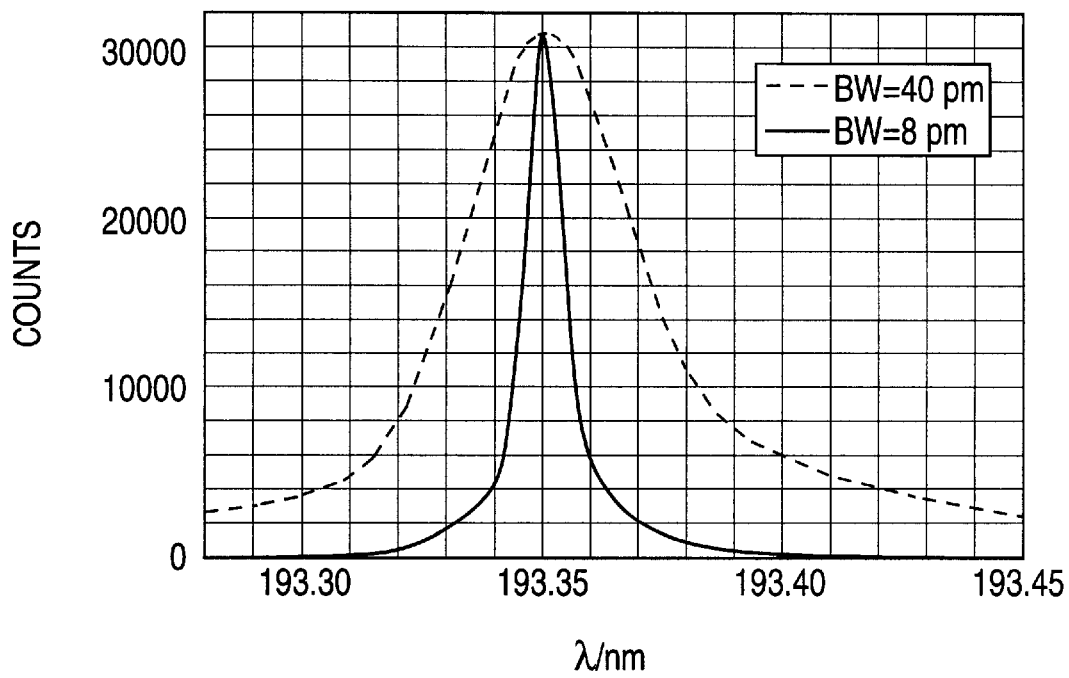
FIG. 6 shows two plots of output emission intensity versus wavelength for a line-narrowed ArF laser having the same resonator designs, except the radius of curvature of the deformable mirror, as shown in FIG. 2, has been adjusted in accord with the preferred embodiment of the present invention.

FIG. 6 illustrates how the bandwidth of an ArF eximer laser may be adjusted. Two spectra are shown, one with dashed lines and the other with solid lines. The dashed line spectrum is for an ArF laser output beam with a bandwidth around 40 pm FWHM and a center wavelength around 193.35 nm. The solid line spectrum is for the same ArF laser as the dashed line spectrum of FIG. 6, except the deformable resonator reflector 15 of the resonator of the ArF laser was adjusted and the bandwidth correspondingly adjusted. The solid line spectrum shows that the ArF laser output beam bandwidth was adjusted to around 8 pm, from the 40 pm bandwidth shown by the dashed line spectrum. The spectra shown in FIG. 6 illustrate the advantage of bandwidth adjustability of the resonator design of the present invention for use with an ArF-excimer laser. The bandwidth may notably be narrowed by a factor of five from a starting bandwidth by adjusting the curvature of the highly reflective mirror 15 shown in FIG. 2.

Those skilled in the art will appreciate that the just-disclosed preferred embodiments are subject to numerous adaptations and modifications without departing from the scope and spirit of the invention. Therefore, it is to be understood that, within the scope and spirit of the invention, the invention may be practiced other than as specifically described above. The scope of the invention is thus not limited by the particular embodiments described above. Instead, the scope of the present invention is understood to be encompassed by the language of the claims that follow, and structural and functional equivalents thereof.

What is claimed is:

1. A line-narrowed excimer or molecular fluorine laser system, comprising:

a gain medium;

a resonator surrounding the gain medium for generating a laser beam, said resonator including a deformable non-dispersive resonator reflector;

a discharge circuit including a plurality of electrodes for energizing the gain medium; and a line-narrowing unit within the resonator for narrowing the bandwidth of the laser system.

2. The laser system of claim 1, wherein said deformable resonator reflector is a cylindrical mirror.

3. The laser system of claim 1, wherein said deformable resonator reflector is a spherical mirror.

4. The laser system of any of claims 1–3, wherein said deformable resonator reflector is a highly reflective mirror.

5. The laser system of claim 1, wherein said deformable resonator reflector is an output coupler.

6. The laser system of claim 1, wherein said line-narrowing unit is separate from said deformable resonator reflector.

\* \* \* \* \*